US006910175B2

(12) United States Patent
Krishnamachari

(10) Patent No.: US 6,910,175 B2
(45) Date of Patent: Jun. 21, 2005

(54) ENCODER REDUNDANCY SELECTION SYSTEM AND METHOD

(75) Inventor: Santhana Krishnamachari, Ossining, NY (US)

(73) Assignee: Koninklijke Philips Electronics N.V., Eindhoven (NL)

(*) Notice: Subject to any disclaimer, the term of this patent is extended or adjusted under 35 U.S.C. 154(b) by 587 days.

(21) Appl. No.: 09/952,193

(22) Filed: Sep. 14, 2001

(65) Prior Publication Data

US 2003/0056168 A1 Mar. 20, 2003

(51) Int. Cl.[7] .............................................. H03M 13/00
(52) U.S. Cl. ..................................... 714/774; 714/746
(58) Field of Search ................................ 714/774, 746; 374/240.11; 348/607, 616; 375/240.27, 240.12

(56) References Cited

U.S. PATENT DOCUMENTS

| | | | | |
|---|---|---|---|---|
| 5,353,059 A | * | 10/1994 | Lawlor et al. | 375/240.11 |
| 6,040,879 A | * | 3/2000 | Park | 375/240.27 |

OTHER PUBLICATIONS

D. Wu et al; "An End–Toend Approach for Optimal Mode Selection in Internet Video Communication: Theory and Application", IEEE Journal on Selected Areas in Communications, Jun. 2000, IEEE, USA, vol. 18, No. 6, pp. 977–995, XP002220690.

R. Zhang et al; "Video Coding with Op;timal Inter/Intra–mode Switching for Packet Loss Resilience", IEEE Journal on Selected Areas in Communications, IEEE Inc. NY, vol. 18, No. 6 Jun. 2000, pp. 966–976, XP000954577.

Jie Song et al; "Optimal Rate Allocation for Video Coding and Transmission Over Wireless Channels", 2001 IEEE Intern. Conf. on Acoustics, Speech, and Signal Processing, Proceedings (CAT No. 01CH37221), 2001 IEEE Intern. Conf. on Acoustics, Speech, and Signal Processing. Salt Lake City, UT, 7/11—, May 2001, Piscataway, NJ, pp. 1385–1388, vol., 3, XP002220691.

B. Girod et al; "Feedback–Based Error Control for Mobile Video Transmission" Proceedings of the IEEE, NY, vol. 87, Nr.10, pp. 11707–1723, XP000927243.

H. Sanneck et al; "Speech–Property–Based FEC for Internet Telephony Applications", Multimedia Computing and Networking 2000, San Jose, CA, Jan. 24–26, 2000, Proceedings of the SPIE– The International Society for Optical Engineering, 2000, SPIE–Int. Soc. Opt. Eng, USA, pp. 38–51 XP002220692.

* cited by examiner

*Primary Examiner*—Phung My Chung

(57) ABSTRACT

A system and method that selects an encoder redundancy scheme based on the projected cost of concealing the errors using an anticipated error concealment strategy. The invention provides a system for encoding a data set, comprising: a system that anticipates an error concealment strategy that will be used by a decoder in the event that the data set contains errors when received by the decoder; an analysis system that projects a cost for concealing the errors using the error concealment strategy; and a system that selects a redundancy scheme for encoding the data set based on the projected cost of concealing the errors using the error concealment strategy. Also provided is a decoder system for decoding packets of data, comprising: at least one error concealment strategy for concealing errors in an erroneously received packet of data; and a feedback system that provides feedback information regarding the error concealment strategy used by the decoder system to conceal the errors.

22 Claims, 1 Drawing Sheet

ENCODER REDUNDANCY SELECTION SYSTEM AND METHOD

BACKGROUND OF THE INVENTION

1. Technical Field

The present invention relates generally to encoder redundancy systems, and more specifically to a system and method of selecting an encoder redundancy scheme based on a projected cost of implementing an anticipated decoder error concealment algorithm.

2. Related Art

Redundancy strategies are used to correct errors introduced into electronic data and information. The types of data that can be protected may include, for example, simple data files, multimedia data (e.g., video and audio), or web pages. Errors primarily occur during transmission, but can also be caused by other activities such as writing or reading data to or from storage. Error protection schemes function by adding redundancy to the data, which can be used by a decoder or receiver to both detect and correct errors. However, because bandwidth is typically at a premium in any communication system, and redundancy schemes consume bandwidth, redundancy must be optimally implemented.

When data packets, such as compressed video, are transmitted over error prone networks (e.g., the internet or wireless networks), redundancy can be added by the encoder to counter the transmission errors. Known redundancy strategies include forward error correction coding schemes, retransmission schemes, and/or use of error resilient coding schemes. Presently, redundancy is often decided based on: (1) the characteristics of the data being encoded; and (2) the transmission channel conditions. In the data characteristic case, the amount of redundancy can be made proportional to the relative importance of the particular portion of the data being encoded. For example, in compressed video systems, such as MPEG-2, I frames are considered more important than P and B frames, and the base layer is considered more important than the enhancement layers. Thus, an I frame or a base layer generally receives more redundancy.

When transmission errors occur (i.e., data is missing or corrupted), the decoder can perform an error concealment to hide the errors. Known error concealment techniques include copying algorithms (e.g., replacing a corrupt video block in a frame with a similar block in neighboring frame), averaging (e.g., replacing a corrupt block in a video frame with an average of several blocks in similar neighboring frames), spatial interpolation, etc. The projected cost of implementing an error concealment strategy may be a measure of, e.g., the residual error after concealment, the estimated computational resources, etc. However, depending on the situation at the decoder, the projected cost for implementing error concealment can vary. For example, in a slow moving video sequence, the video data may not change a lot from frame to frame, thereby making it easy to conceal the transmission error with a simple concealment technique. Conversely, in a fast moving sequence, the decoder may require a more complex concealment technique and therefore consume significant computational overhead to conceal the error. In this case, it would be beneficial for the fast moving sequence to have more redundancy in the event an error occurs.

Unfortunately, until now, existing systems fail to take into account the projected cost of implementing error concealment at the decoder when determining the redundancy scheme implemented by the encoder. Accordingly, a need exists for a system that utilizes the projected cost of implementing error concealment when determining an encoder redundancy scheme.

SUMMARY OF THE INVENTION

The present invention addresses the above-mentioned problems, as well as others by providing a system and method that selects an encoder redundancy scheme based on the projected cost of concealing the errors using an anticipated error concealment strategy. In a first aspect, the invention provides a system for encoding a data set, comprising: a system that anticipates an error concealment strategy that will be used by a receiver if the data set contains errors when received by the receiver; an analysis system that projects a cost for concealing the errors using the error concealment strategy; and a system that selects a redundancy scheme for encoding the data set based on the projected cost of concealing the errors using the error concealment strategy.

In a second aspect, the invention provides a program product stored on a recordable medium that, when executed, encodes a data set, the program product comprising: program code configured to anticipate an error concealment strategy that will be used by a receiver if the data set contains an error when received by the receiver; program code configured to project a cost for concealing the error using the error concealment strategy; and program code configured to select a redundancy scheme for encoding the data set based on the projected cost of concealing the error using the error concealment strategy.

In a third aspect, the invention provides a decoder system for decoding packets of data, comprising: at least one error concealment strategy for concealing errors introduced in a received packet of data; and a feedback system that provides feedback information regarding the error concealment strategy used by the decoder system to conceal the errors.

In a fourth aspect, the invention provides a method of encoding a data set, comprising the steps of: anticipating an error concealment strategy that will be used by a decoder if the data set contains errors when received by the decoder; projecting a cost for concealing the errors using the error concealment strategy; and selecting a redundancy scheme for encoding the data set based on the projected cost of concealing the errors using the error concealment strategy.

BRIEF DESCRIPTION OF THE DRAWINGS

The preferred exemplary embodiment of the present invention will hereinafter be described in conjunction with the appended drawings, where like designations denote like elements, and.

DETAILED DESCRIPTION OF THE INVENTION

Figure 1:
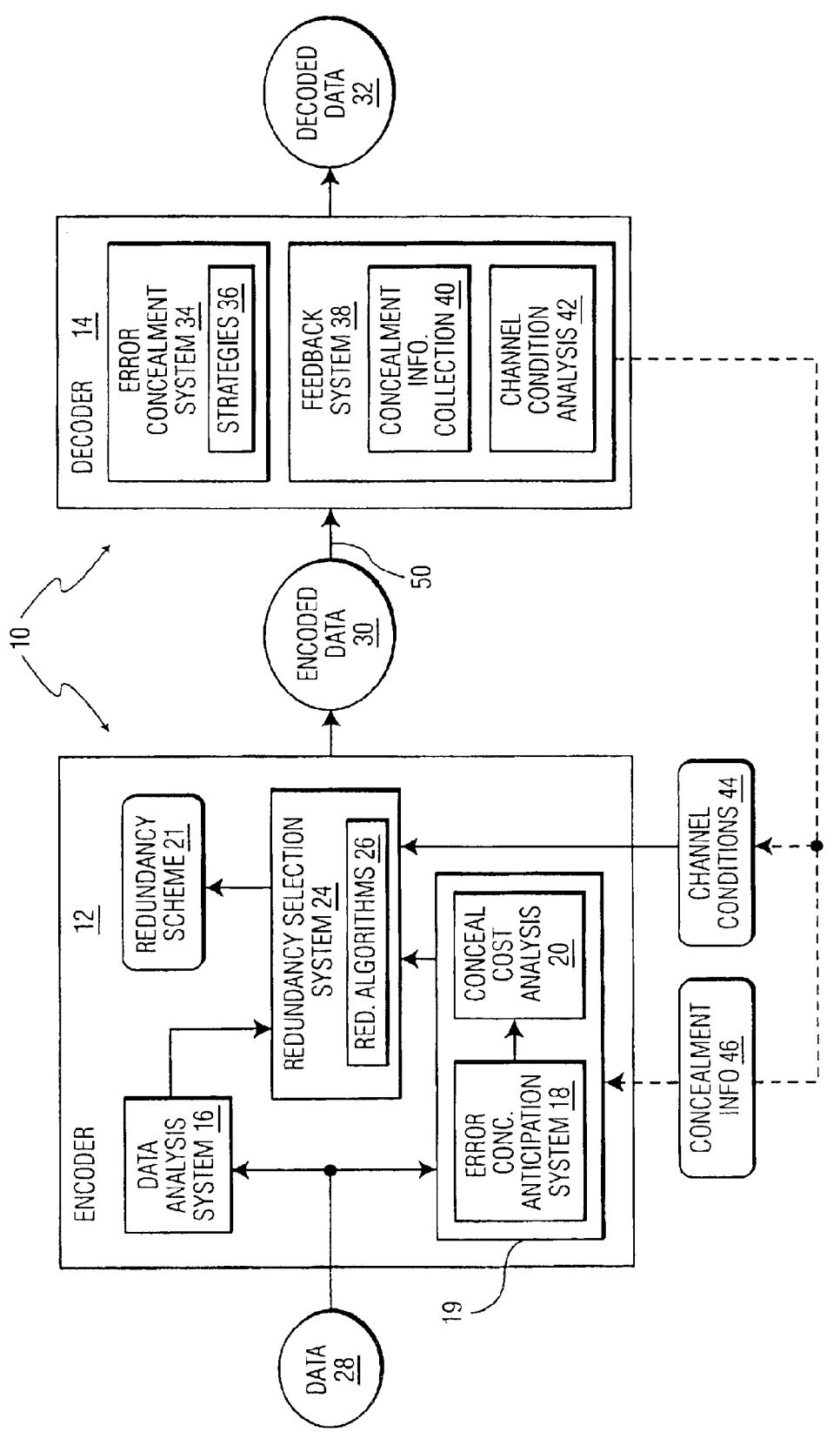
FIG. 1 depicts a block diagram of an encoding/decoding system that includes a redundancy selection system in accordance with a preferred embodiment of the present invention.

Referring now to FIG. 1, an error protection system 10 is shown that includes: (1) an encoder 12 for receiving data 28 and generating encoded data 30; (2) a transmission channel 50 for transmitting encoded data 30; and (3) a decoder 14 for receiving encoded data 30 and generating decoded data 32. As will be described in detail below, encoder 12 includes the ability to add error protection (i.e., redundancy) to data 28 before transmission, and decoder 14 includes the ability to conceal errors after the data is received. While in the preferred embodiment data 28 comprises video data, it is understood that data 28 may comprise any type of data capable of being transmitted from encoder 10 to decoder 14.

Encoder 10 may comprise any type of system for processing data 28 for transmission over transmission channel 50, including a data compression system, such those that utilize MPEG-2, MPEG-4, etc., technologies. Conversely, encoder 10 may comprise a transmitter that simply packages data 28 with redundancy information. Transmission channel 50 may comprise any type of transmission channel, e.g., the Internet, a wireless system, a LAN, Ethernet cable, etc. Similar to encoder 10, decoder 14 may comprise any type of system for processing encoded data 30, including any type of system that decodes compressed data. Furthermore, decoder 14 may simply comprise a receiver that can receive encoded data 30.

Encoder 12 includes a redundancy selection system 24 that adds redundancy to data 28, which can be used by decoder 14 in the event that errors occur while encoded data 30 is transmitted over transmission channel 50. Redundancy selection system 24 may include any type of known redundancy algorithm(s) 26, such as a forward error correction scheme, a retransmission scheme, an error resilient coding scheme, etc. Redundancy selection system 24 determines (or selects) a redundancy scheme (e.g., how much redundancy and/or what type of redundancy) for each inputted set of data. The selected redundancy scheme is determined based on one or more inputs. The inputs may include information from a data analysis system 16, information regarding transmission channel conditions 44, and information determined from concealment analysis system 19.

Data analysis system 16 provides information regarding the characteristics of the data 28 being encoded. For example, in video encoding, I frames are considered more important than P or B frames, and the base layer is considered more important than the enhancement layers. Accordingly, I frame and base layer data may be encoded with more redundancy in order to guard against potential losses that may occur during transmission. In this manner, the more important data can be identified and made easier to recover. It is understood that data 28 may be characterized in any known manner.

Channel conditions 44 provide information regarding the quality of the transmission channel 50, e.g., an error rate. Channel conditions 44 may be obtained from a feedback system 38 residing within decoder system 14, determined based on predicted characteristics, or from any other known method.

Concealment analysis system 19 provides information regarding the type and cost of an anticipated error concealment strategy that will be used by decoder 14. The information provided by concealment analysis system 19 can either be obtained explicitly from feedback system 38 of decoder 14, or implicitly, i.e., without feedback from decoder 14. The input provided by concealment analysis system 19 allows redundancy selection system 24 to more optimally decide the amount of redundancy that needs to be used by the encoder. For example, assume that the relative importance (i.e., characteristics) of two pieces of data (e.g., macroblocks) are equal, but based on the anticipated error concealment strategy implemented by the decoder, the first piece of data will be easier to recover than the second. Concealment analysis system 19 will report that information to redundancy selection system 24 so that the first piece of data can be protected with a relatively smaller amount of redundancy. Since the redundancy selection system 24 knows that the decoder 14 will be able to recover the first piece of data more efficiently in the event of a transmission error, a smaller amount of redundancy can be utilized in order to save bandwidth. Similarly, the second piece of data, which will be harder to recover, can be protected with a relatively larger amount of redundancy.

Concealment analysis system 19 includes an error concealment anticipation system 18 and a concealment cost analysis system 20. Error concealment anticipation system 18 determines the type of error concealment strategy will be used by decoder 14 in the event that errors occur during transmission. One method for anticipating the type of error concealment strategy 36 that will be used is with concealment information 46 fed back from decoder 14. In this case, concealment information 46 may include a feedback signal that tells the encoder before the start of and/or during the transmission of encoded data 30 what type of error concealment strategy 36 will be implemented. Alternatively, in the implicit case where there is no feedback, error concealment anticipation system 18 may be hard-coded with an expected strategy or programmed with a prediction routine to predict the likely error concealment strategy, e.g., based on the inputted data 28 or some other criteria.

Once an anticipated concealment strategy is determined, concealment cost analysis system 20 can determine a projected cost for implementing the concealment strategy. The projected cost may be a measure of, for example, the residual error after concealment and the estimated computational resources required by decoder 14 to implement the anticipated error concealment strategy 36. The projected cost to conceal error may be based on: (1) the anticipated concealment strategy, (2) the actual inputted data 28, and/or (3) some other criteria. Concealment cost analysis system 20 may report the projected concealment cost of data 28 to redundancy selection system 24 in any manner, e.g., as easy, medium, or hard.

In an alternative embodiment, the concealment cost may also be determined directly from concealment information 46 fed back from decoder 14. In this case, concealment cost analysis system 20 would simply collect, format if necessary, and pass the information to redundancy selection system 24.

Once redundancy selection system 24 has obtained the above-described inputs, a redundancy scheme 21 can be implemented for encoding data 28, and encoder 12 can then output/transmit encoded data 30 over transmission channel 50. Encoded data 30 can then be inputted/received by decoder 14 where it will be checked for errors and decoded.

Decoder system 14 comprises an error concealment system 34, and may also include a feedback system 38 (for the case where explicit concealment information is being used by encoder 12.) Error concealment system 34 includes one or more concealment strategies 36 for concealing errors that may have been introduced into encoded data 30. Any known strategy 36 may be utilized, including copying data from neighboring video frames, averaging, spatial interpolation, etc. As noted, depending on the implemented strategy 36 and the type of data being processed, the cost for implementing error concealment may vary (i.e., concealment may be relatively easy or relatively difficult).

Feedback system 38 collects and reports such concealment information 46 back to the encoder for use by concealment analysis system 19. Information regarding the cost for concealing errors and/or the particular strategy used for concealing errors is collected by concealment information collection system 40. Such information may comprise raw or statistical information (e.g., category of data, type of concealment strategy used, residual error after concealment, computational requirements) that is saved each time encoded data 30 requires error correction or concealment. Feedback system 38 may also include a channel condition analysis system 42 for feeding back channel conditions 44, to be used in the manner described above.

It is understood that the systems, functions, methods, and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the preferred embodiments of the invention have been presented for purposes of illustration and description. They are not intended to be exhaustive or to limit the invention to the precise form disclosed, and obviously many modifications and variations are possible in light of the above teachings. Such modifications and variations that are apparent to a person skilled in the art are intended to be included within the scope of this invention as defined by the accompanying claims.

What is claimed is:

1. A system for encoding a data set, comprising:
    a system that anticipates an error concealment strategy to be used by a receiver if the data set contains errors when received by the receiver;
    an analysis system that projects a cost for concealing the errors using the error concealment strategy; and
    a system that selects a redundancy scheme for encoding the data set based on the projected cost of concealing the errors using the error concealment strategy.

2. The system of claim 1, further comprising:
    a data analysis system that characterizes the data set being encoded by the encoding system; and
    wherein the redundancy scheme is further selected based on the characterization of the data set.

3. The System of claim 1, further comprising:
    a channel analysis system that analyzes a transmission channel; and
    wherein the redundancy scheme is further selected based on the transmission channel analysis.

4. The system of claim 1, wherein the error concealment strategy is anticipated using feedback from the receiver.

5. The system of claim 1, wherein the error concealment strategy is anticipated without feedback from the receiver.

6. The system of claim 1, wherein the projected cost is based on a residual error after concealment and a required amount of computational resources to conceal the errors.

7. The system of claim 1, wherein an amount of redundancy provided by the selected redundancy scheme is proportional with the projected cost.

8. The system of claim 1, wherein the redundancy scheme comprises a forward error correction scheme.

9. The system of claim 1, wherein the redundancy scheme comprises a retransmission scheme.

10. The system of claim 1, wherein the error concealment; strategy comprises a copying algorithm.

11. The system of claim 1, wherein the error concealment strategy comprises an averaging algorithm.

12. The system of claim 1, wherein the data set comprises video data.

13. A program product stored on a computer readable medium that, when executed, encodes a data set, the program product comprising:
    program code configured to anticipate an error concealment strategy that will be used by a receiver if the data set contains an error when received by the receiver;
    program code configured to project a cost for concealing the error using the error concealment strategy; and
    program code configured to select a redundancy scheme for encoding the data set based on the projected cost of concealing the error using the error concealment strategy.

14. The program product of claim 13, wherein the error concealment strategy is anticipated using feedback from the receiver.

15. The program product of claim 13, wherein the error concealment strategy is anticipated without feedback from the receiver.

16. The program product of claim 13, wherein the projected cost as based on a residual error after concealment and a required amount of computational resources to conceal the errors.

17. The program product of claim 13, wherein an amount of redundancy provided by the selected redundancy scheme is proportional with the projected cost.

18. A decoder system for decoding packets of data, comprising:
    at least one error concealment strategy for concealing errors introduced in a received packet of data; and
    a feedback system that provides feedback information to an encoder regarding the error concealment strategy used by the decoder system to conceal the errors,
    wherein the feedback information further includes a cost for implementing the concealment strategy at the decoder system.

19. The decoder system of claim 18, wherein the feedback system further provides feedback regarding a transmission channel used to receive the packet of data.

20. A method of encoding a data set, comprising the steps of:
    anticipating an error concealment strategy that will be used by a decoder if the data set contains errors when received by the decoder;
    projecting a cost for concealing the errors using the error concealment strategy; and
    selecting a redundancy scheme for encoding the data set based on the projected coat of concealing the errors using the error concealment strategy.

21. The method of claim 20, wherein the step of anticipating the error concealment strategy includes the step of receiving feedback from the decoder, wherein the feedback includes information regarding a previous handling of errors by the decoder.

22. The method of claim 21, wherein the step of projecting the cost for concealing the errors includes the step of examining the feedback from the decoder.

* * * * *